(12) United States Patent
Kim

(10) Patent No.: US 7,951,706 B2
(45) Date of Patent: May 31, 2011

(54) METHOD OF MANUFACTURING METAL INTERCONNECTION

(75) Inventor: Tae Woo Kim, Icheon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 264 days.

(21) Appl. No.: 12/200,969

(22) Filed: Aug. 29, 2008

(65) Prior Publication Data
US 2009/0061618 A1   Mar. 5, 2009

(30) Foreign Application Priority Data

Aug. 30, 2007   (KR) .................. 10-2007-0087532

(51) Int. Cl.
*H01L 21/4763*   (2006.01)
(52) U.S. Cl. .. 438/633; 438/626; 438/697; 257/E21.576
(58) Field of Classification Search .................. 438/623, 438/625–626, 633, 637, 697, 692; 257/E21.576, 257/E21.58, E21.583
See application file for complete search history.

(56) References Cited

U.S. PATENT DOCUMENTS

| 5,272,117 A | * | 12/1993 | Roth et al. | ........................ 438/14 |
| 6,180,510 B1 | * | 1/2001 | Hayashi | ........................ 438/626 |
| 2007/0148967 A1 | * | 6/2007 | Kim et al. | ........................ 438/638 |

FOREIGN PATENT DOCUMENTS

| KR | 10-2000-0027938 | 5/2000 |
| KR | 10-2003-0060480 | 7/2003 |
| KR | 10-2006-0042917 | 10/2006 |

* cited by examiner

*Primary Examiner* — Thanhha Pham
(74) *Attorney, Agent, or Firm* — Saliwanchik, Lloyd & Eisenschenk

(57) ABSTRACT

A method of manufacturing a semiconductor is provided. A fist metal layer can be formed on a lower structural layer, and an interlayer metal dielectric (IMD) layer can be formed on the first metal layer. A sacrificial oxide layer can be formed on the IMD layer, and a planarization process can be performed on the sacrificial oxide layer and the IMD layer to substantially eliminate a height difference of the IMD layer.

16 Claims, 2 Drawing Sheets

METHOD OF MANUFACTURING METAL INTERCONNECTION

CROSS-REFERENCE TO RELATED APPLICATION

The present application claims the benefit under 35 U.S.C. §119 of Korean Patent Application No. 10-2007-0087532, filed Aug. 30, 2007, which is hereby incorporated by reference in its entirety.

BACKGROUND

When forming a metal interconnection in a semiconductor device, a first metal layer is typically formed on a semiconductor substrate or a dielectric. A buffer layer for inhibiting copper from diffusing can be deposited. An interlayer metal dielectric (IMD) layer is then typically formed on the buffer layer. Next, a via/trench process is performed, and a metal barrier layer is formed on the IMD layer. The via/trench is generally filled with copper to form a contact and a second metal layer. The metal barrier layer not in the via/trench is removed by performing a planarization process.

FIG. 1 is a cross-sectional view of a metal layer having a height difference thereon.

As described above, referring to FIG. 1, copper is generally deposited on a semiconductor substrate or a dielectric 10 to form a first metal layer 20. A buffer layer (not shown) and an IMD layer (not shown) are deposited on the first metal layer 20.

When the buffer layer and the IMD layer are deposited, a thermal stress is exerted on the first metal layer 20. The thermal stress acts to concentrate copper ions to a triple point of a copper crystalline structure.

Therefore, a hill-shaped height difference 22 is generated on the first metal layer 20.

The height difference 22 is then generated along surfaces of the buffer layer, the IMD layer, and the metal barrier layer formed on the first metal layer 20. Also, the area and the height of the height difference gradually increases on each subsequent layer.

Accordingly, the metal barrier layer is typically not uniformly planarized due to the height difference thereon.

In addition, the operation of chemical mechanical polishing (CMP) equipment is generally controlled by the polishing speed of each layer, and the CMP equipment stops when the IMD layer is reached during the metal barrier layer polishing process. With the IMD layer acting as an etch stop for the CMP process, a height difference in a portion of the IMD layer caused by the hill-shaped surface defect of the first metal layer may cause the CMP to stop polishing before all of the metal barrier layer is removed. This is because the CMP equipment determines that the entire surface of the metal barrier layer was planarized from a sensing of an exposed top surface of the IMD layer.

When a substantial portion of the metal barrier layer not in the via and/or trench remains, a contact and second metal layer disposed in the via/trench can be shorted. Therefore, operation reliability and product yield of the semiconductor device can be significantly degraded. Accordingly, there exists a need in the art for an improved method of manufacturing a semiconductor device.

BRIEF SUMMARY

Embodiments of the present invention provide methods for manufacturing a semiconductor device that can inhibit a metal barrier layer from leaving a residue that can be generated by a height difference caused by an uneven surface of a lower metal layer.

Embodiments of the present invention also provide methods for manufacturing a semiconductor device that can inhibit a metal interconnection from being shorted by substantially eliminating a residue of a metal barrier layer that might otherwise be present. Accordingly, operation characteristics of the semiconductor device can be improved.

In an embodiment, a method of manufacturing a semiconductor device can comprise: forming a first metal layer on a lower structural layer; forming an interlayer metal dielectric (IMD) layer on the first metal layer; forming a sacrificial oxide layer on the IMD layer; and planarizing the sacrificial oxide layer and a portion of the IMD layer to substantially eliminate a height difference that may exist in the IMD layer and provide a substantially flat IMD layer.

The details of one or more embodiments of the present invention are set forth in the accompanying drawings and the description below. Other features will be apparent to a skilled artisan from the detailed description, the drawings, and the claims.

DETAILED DESCRIPTION

When the terms "on" or "over" or "above" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

Reference will now be made in detail to the embodiments of the present disclosure, examples of which are illustrated in the accompanying drawings.

Figure 1:
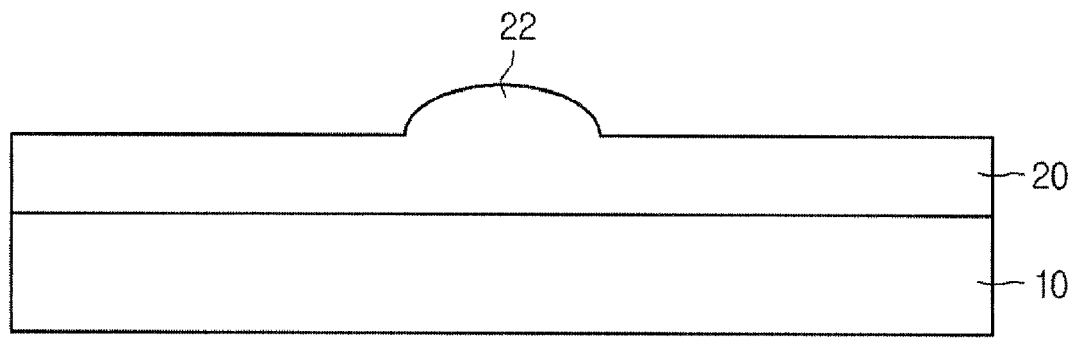
FIG. 1 is a cross-sectional view of a metal layer having a height difference thereon.
Figure 2:
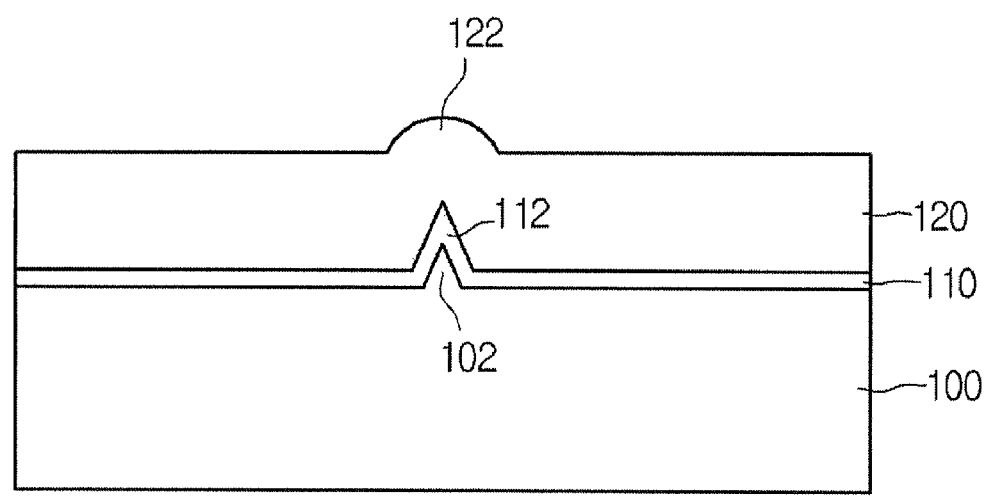
FIGS. 2-4 are cross-sectional views of a method for manufacturing a semiconductor device according to an embodiment of the present invention.
Figure 3:
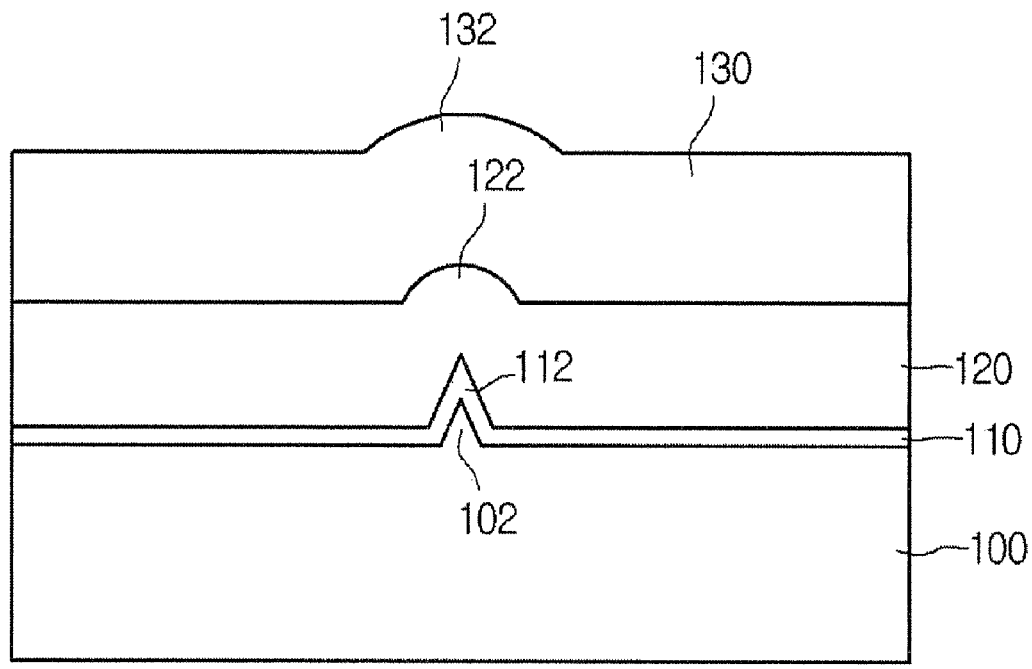
Figure 4:
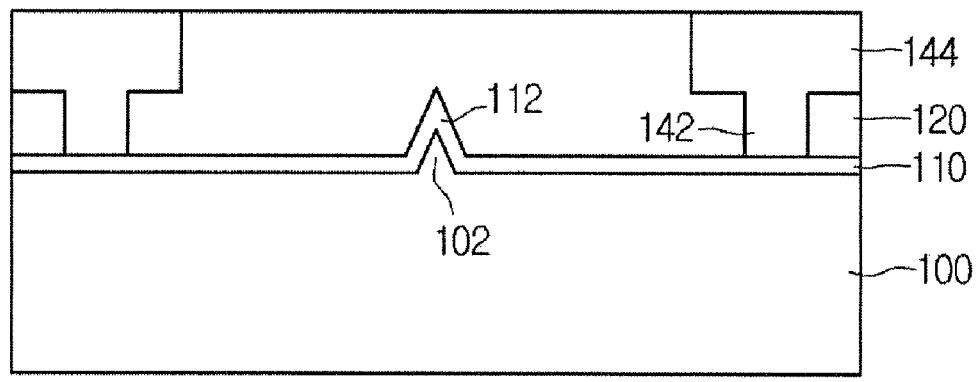

FIGS. 2-4 are cross-sectional views of a method for manufacturing a semiconductor device according to an embodiment of the present invention.

Referring to FIG. 2, a first metal layer 100 can be formed on a lower structural layer (not shown). The lower structural layer (not shown) can be any suitable layer known in the art, such as a semiconductor substrate or a dielectric layer. The first metal layer can include any suitable material known in the art, for example, copper.

A buffer layer 110 can be formed on the first metal layer 100, and an interlayer metal dielectric (IMD) layer 120 can be formed on the buffer layer 110. The buffer layer can help inhibit diffusion of the metal material of the first metal layer. Though embodiments with a buffer layer 110 are illustrated by way of example, certain embodiments of the present invention can omit the buffer layer 110.

In an embodiment, a high temperature heat treatment process can be performed as the buffer layer 110 and/or the IMD layer 120 are formed. A height difference 102 can occur on the first metal layer 100 due to thermal stress generated during the high temperature heat treatment process.

The height difference 102 on the first metal layer 100 can cause a height difference 112 in the buffer layer 110 and a height difference 122 in the IMD layer 120. In an embodiment, the height difference 112 on the buffer layer 110 can be larger than the height difference 102 on the first metal layer 100. In a further embodiment, the height difference 122 on the IMD layer 110 can be larger than the height difference 112 on the buffer layer 110. This may be caused by the compounding effect of the height difference.

Referring to FIG. 3, a sacrificial oxide layer 130 can be formed on the IMD layer 120. The sacrificial oxide layer 130 can be formed through any suitable process known in the art.

In an embodiment, the sacrificial oxide layer 130 can be formed using a plasma enhanced chemical vapor deposition (PECVD) process. In the PECVD process, an electric field and a magnetic field can be applied to form plasma ions having high density, and source gas can be thermally decomposed to deposit the sacrificial oxide layer 130. In certain embodiments, the sacrificial oxide layer 130 can be a dielectric layer.

The height of the sacrificial oxide layer 130 can be from about five times to about ten times greater than that of the height difference 122 on the IMD layer 120. Since the height of the sacrificial oxide layer 130 can be so much greater than that of the height difference 122 on the IMD layer 120, the height difference 102 of the first metal layer 100 can be gradually converted into a wide and gentle height difference 132 on the sacrificial oxide layer 130. The height of the height difference 132 on the sacrificial layer 130 can be less than that of the height difference 122 of the IMD layer 120.

Accordingly, the sacrificial oxide layer 130 can be completely and uniformly planarized. The sacrificial oxide layer 130 can be planarized using any suitable process known in the art.

In an embodiment, the sacrificial oxide layer 130 can be planarized using a chemical mechanical polishing (CMP) process. In such an embodiment, CMP equipment does not have a substantial effect due to the height difference 122 of the IMD layer 120 because the sacrificial oxide layer 130 and the IMD layer 120 can each be an oxide layer. Thus, the sacrificial oxide layer 130 and the IMD layer 120 can be treated as the same layer by the CMP equipment.

The sacrificial oxide layer 130 and the IMD layer 120 can be planarized during the same CMP process to remove the height difference 122 of the IMD layer 120.

Referring to FIG. 4, the IMD layer 120 can be etched to form a via and a trench. Any suitable process known in the art can be used to etch the IMD layer 120. In an embodiment, a metal barrier layer (not shown) can be formed on the IMD layer 120 and in the via and the trench. A skilled artisan will readily recognize that, while a via and a trench have been shown by way of example, embodiments of the present invention include forming only a via or only a trench.

The metal barrier layer can be formed of any suitable material, for example, titanium nitride. The metal barrier layer can be formed such that the via and the trench are covered with the metal barrier layer. Though examples with a metal barrier layer have been described, embodiments of the present invention are not limited thereto. In certain embodiments, the metal barrier layer can be omitted.

Then, a metal can be deposited on the IMD layer and in the via and/or the trench. The metal can be any suitable material known in the art, for example, copper. The metal deposited in the via can serve as a contact 142, and the metal deposited in the trench can serve as a second metal layer 144.

After depositing the metal barrier layer (if present) and the metal, a planarization process can be performed to expose the IMD layer 120 and to remove at least a portion of the metal barrier layer (if present) and the metal outside the trench. Accordingly, a metal interconnection can be formed. In an embodiment, all of the metal barrier layer and the metal that is not in the trench or the via can be removed through the planarization process.

According to embodiments of the present invention, the height difference 122 of the IMD layer 120 can be completely removed, thereby inhibiting the formation of a height difference on the metal barrier layer. In addition, the second metal layer 144 can be inhibited from shorting with an adjacent metal layer.

Additionally, according to embodiments of the present invention, since the metal barrier layer outside the trench and the via can be completely removed, the metal interconnection can be inhibited from shorting due to residue of the metal barrier layer that might otherwise be present. Thus, operation reliability and product yield of the semiconductor device can be improved.

Any reference in this specification to "one embodiment," "an embodiment," "exemplary embodiment," etc., means that a particular feature, structure, or characteristic described in connection with the embodiment is included in at least one embodiment of the disclosure. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with others of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method of manufacturing a semiconductor device, comprising:
   forming a first metal layer on a lower structural layer;
   forming an interlayer metal dielectric (IMD) layer on the first metal layer, wherein a first height difference is formed in the first metal layer during forming the IMD layer, and wherein a second height difference corresponding to the first height difference is formed in the IMD layer;
   forming a sacrificial oxide layer having a third height difference corresponding to the second height difference on the IMD layer, wherein a height of the sacrificial oxide layer is greater than that of the height difference in the IMD layer, and wherein a height of the third height difference is less than that of the first height difference and that of the second height difference; and
   planarizing the sacrificial oxide layer and a portion of the IMD layer to substantially eliminate the second height difference in the IMD layer and provide a substantially flat IMD layer.

2. The method according to claim 1, wherein forming the sacrificial oxide layer comprises performing a plasma enhanced chemical vapor deposition process.

3. The method according to claim 1, wherein a height of the sacrificial oxide layer is from about five times to about ten times greater than that of the height difference in the IMD layer.

4. The method according to claim 1, wherein planarizing the sacrificial oxide layer and a portion of the IMD layer comprises performing a chemical mechanical polishing process.

5. The method according to claim 1, further comprising forming a via and a trench in the IMD layer.

6. The method according to claim 5, further comprising depositing a metal on the IMD layer and in the via and the trench.

7. The method according to claim 6, further comprising planarizing the deposited metal to remove at least a portion of the deposited metal not in the via or the trench.

8. The method according to claim 6, further comprising forming a metal barrier layer on the IMD layer and in the via and the trench before depositing the metal.

9. The method according to claim 8, further comprising performing a planarization process to remove at least a portion of the deposited metal not in the via or the trench and at least a portion of the metal barrier layer not in the via or the trench.

10. The method according to claim 6, wherein a portion of the deposited metal inside the trench forms a second metal layer, and wherein a portion of the deposited metal in the via forms a contact electrically connecting the first metal layer to the second metal layer.

11. The method according to claim 1, further comprising firming a via or a trench in the IMD layer.

12. The method according to claim 11, further comprising depositing a metal on the IMD layer and in the via or trench.

13. The method according to claim 12, further comprising planarizing the deposited metal to remove at least a portion of the deposited metal not in the via or trench.

14. The method according to claim 12, further comprising forming a metal barrier layer on the IMD layer and in the via or trench before depositing the metal.

15. The method according to claim 14, further comprising performing a planarization process to remove at least a portion of the deposited metal not in the via or the trench and at least a portion of the metal barrier layer not in the via or the trench.

16. The method according to claim 1, further comprising forming a buffer layer on the first metal layer before forming the IMD layer.

\* \* \* \* \*